US009926467B2

(12) United States Patent
Miller et al.

(10) Patent No.: US 9,926,467 B2
(45) Date of Patent: Mar. 27, 2018

(54) SUPERHYDROPHOBIC COMPOSITIONS AND COATING PROCESS FOR THE INTERNAL SURFACE OF TUBULAR STRUCTURES (71) Applicants: Southwest Research Institute, San Antonio, TX (US); Shell Oil Company, Houston, TX (US)

(72) Inventors: Michael A. Miller, San Antonio, TX (US); Ronghua Wei, San Antonio, TX (US); Gregory J. Hatton, Houston, TX (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 0 days.

(21) Appl. No.: 15/644,236

(22) Filed: Jul. 7, 2017

(65) Prior Publication Data
US 2017/0306182 A1 Oct. 26, 2017

Related U.S. Application Data (62) Division of application No. 14/819,129, filed on Aug. 5, 2015, now Pat. No. 9,701,869, which is a division
(Continued)

(51) Int. Cl.
*C09D 183/04* (2006.01)
*F16L 58/10* (2006.01)
(Continued)

(52) U.S. Cl.
CPC ............. *C09D 183/04* (2013.01); *B05D 1/62* (2013.01); *B05D 5/08* (2013.01); *B05D 7/222* (2013.01);
(Continued)

(58) Field of Classification Search
CPC .... C09D 183/04; F16L 58/1009; E21B 17/00; B05D 7/222; B05D 1/62; B05D 2202/10;
(Continued)

(56) References Cited

U.S. PATENT DOCUMENTS 4,374,722 A 2/1983 Zega
4,377,773 A 3/1983 Hershcovitch et al.
(Continued)

FOREIGN PATENT DOCUMENTS

CN 1545722 A 11/2004
CN 1648283 A 8/2005
(Continued)

OTHER PUBLICATIONS

International Search Report and Written Opinion dated Aug. 26, 2008 issued in related International Patent Application No. PCT/US08/64344.
(Continued)

*Primary Examiner* — Michael C Miggins
(74) *Attorney, Agent, or Firm* — Grossman, Tucker et al.

(57) ABSTRACT

A method for depositing a coating includes creating a vacuum within an interior volume of a tubular structure, wherein the tubular structure also includes an internal surface. Gas is supplied to the interior volume of the tubular structure, wherein the gas includes a plasma precursor in the gas phase. The tubular structure is biased relative to ground. Plasma having a density is formed and cyclically positioned along the length of the tubular structure. Positive ions of the plasma precursor gas are generated and are deposited on the internal surface forming a coating on the internal surface, wherein the coating exhibits a water contact angle of greater than 120°.

3 Claims, 8 Drawing Sheets

Related U.S. Application Data of application No. 13/683,690, filed on Nov. 21, 2012, now Pat. No. 9,121,540.

(51) Int. Cl.

| | | |
|---|---|---|
| *E21B 17/00* | (2006.01) | |
| *B05D 7/22* | (2006.01) | |
| *C23C 16/40* | (2006.01) | |
| *C23C 16/507* | (2006.01) | |
| *B05D 1/00* | (2006.01) | |
| *C23C 16/04* | (2006.01) | |
| *H01J 37/32* | (2006.01) | |
| *B05D 5/08* | (2006.01) | |

(52) U.S. Cl.
CPC .......... *C23C 16/045* (2013.01); *C23C 16/401* (2013.01); *C23C 16/507* (2013.01); *E21B 17/00* (2013.01); *F16L 58/1009* (2013.01); *H01J 37/3244* (2013.01); *H01J 37/32128* (2013.01); *H01J 37/32669* (2013.01); *H01J 37/32834* (2013.01); *B05D 2202/10* (2013.01); *Y10T 428/139* (2015.01)

(58) Field of Classification Search
CPC ....... B05D 5/08; C23C 16/401; C23C 16/507; C23C 16/045; Y10T 428/139; H01J 37/32834; H01J 37/3244; H01J 37/32669; H01J 37/32128
See application file for complete search history.

(56) References Cited

U.S. PATENT DOCUMENTS

| | | | |
|---|---|---|---|
| 4,407,712 | A | 10/1983 | Henshaw et al. |
| 4,520,268 | A | 5/1985 | Xu |
| 4,680,197 | A | 7/1987 | Sagoi et al. |
| 4,731,539 | A | 3/1988 | Xu |
| 4,764,394 | A | 8/1988 | Conrad |
| 4,795,942 | A | 1/1989 | Yamasaki |
| 5,423,915 | A | 6/1995 | Murata et al. |
| 5,458,927 | A | 10/1995 | Malaczynski et al. |
| 5,483,121 | A | 1/1996 | Okagaki et al. |
| 5,593,798 | A | 1/1997 | Muller et al. |
| 5,605,714 | A | 2/1997 | Dearnaley et al. |
| 5,725,573 | A | 3/1998 | Dearnaley et al. |
| 6,055,928 | A | 5/2000 | Murzin et al. |
| 6,087,025 | A | 7/2000 | Dearnaley et al. |
| 6,120,660 | A | 9/2000 | Chu et al. |
| 6,410,144 | B2 | 6/2002 | Dearnaley et al. |
| 6,497,803 | B2 | 12/2002 | Glocker et al. |
| 6,514,565 | B2 | 2/2003 | Dearnaley et al. |
| 6,524,538 | B2 | 2/2003 | Barankova et al. |
| 6,551,445 | B1 | 4/2003 | Yokogawa |
| 6,572,933 | B1 | 6/2003 | Nastasi et al. |
| 6,632,482 | B1 | 10/2003 | Sheng |
| 6,764,714 | B2 | 7/2004 | Wei et al. |
| 6,767,436 | B2 | 7/2004 | Wei et al. |
| 6,878,404 | B2 | 4/2005 | Verrasamy et al. |
| 6,893,907 | B2 | 5/2005 | Maydan et al. |
| 7,052,736 | B2 | 5/2006 | Wei et al. |
| 7,094,670 | B2 | 8/2006 | Collins et al. |
| 7,300,684 | B2 | 11/2007 | Boardman et al. |
| 7,520,965 | B2 | 4/2009 | Wei |
| 7,790,003 | B2 | 9/2010 | Chiang et al. |
| 8,029,875 | B2 | 10/2011 | Wei et al. |
| 2001/0002584 | A1 | 6/2001 | Liu et al. |
| 2004/0025454 | A1 | 2/2004 | Burgess |
| 2004/0055870 | A1 | 3/2004 | Wei |
| 2004/0084152 | A1 | 5/2004 | Gregoire et al. |
| 2004/0168771 | A1 | 9/2004 | Mitrovic |
| 2004/0191436 | A1 | 9/2004 | Wei et al. |
| 2005/0009953 | A1 | 1/2005 | Shea |
| 2005/0061251 | A1 | 3/2005 | Wei et al. |
| 2005/0170668 | A1 | 8/2005 | Park et al. |
| 2005/0287307 | A1 | 12/2005 | Singh et al. |
| 2006/0011468 | A1 | 1/2006 | Boardman et al. |
| 2006/0076231 | A1 | 4/2006 | Wei |
| 2006/0076235 | A1 | 4/2006 | Wei |
| 2006/0121704 | A1 | 6/2006 | Walther et al. |
| 2006/0196419 | A1 | 9/2006 | Tudhope et al. |
| 2006/0198965 | A1 | 9/2006 | Tudhope et al. |
| 2006/0251917 | A1 | 11/2006 | Chiang et al. |
| 2008/0292806 | A1 | 11/2008 | Wei et al. |
| 2009/0280276 | A1 | 11/2009 | Noll |
| 2010/0006421 | A1 | 1/2010 | Wei |
| 2010/0154197 | A1 | 6/2010 | Palmaz et al. |
| 2012/0231177 | A1 | 9/2012 | Wei et al. |

FOREIGN PATENT DOCUMENTS

| | | |
|---|---|---|
| JP | 63026373 | 2/1988 |
| JP | 02205666 A | 8/1990 |
| JP | 02243766 | 9/1990 |
| JP | H1149879 A | 2/1999 |
| JP | 3336665 B2 | 10/2002 |
| WO | 2003025971 A2 | 3/2003 |
| WO | 2014081858 A2 | 5/2014 |

OTHER PUBLICATIONS

International Search Report & Written Opinion dated Apr. 4, 2014 in related PCT/US2013/071059.
U.S. Office Action dated May 11, 2011 issued in related U.S. Appl. No. 12/169,837 (11 pgs).
Anders, "From Plasma Immersion Ion Implantation to Deposition: A Historical Perspective on Principles and Trends," Surface and Coatings Technology, vol. 156, Issues 1-3, Jul. 1, 2002, pp. 3-12.
Apetrei, et al., "Characterization of a Modified Hollow-cathode Discharge Plasma by Optical Means," 32nd EPS Conference of Plasma Phys. Tarragona, Jun. 27-Jul. 1, 2005 ECA vol. 29C, p. 4.139 (2205), 4 pgs.
Casserly, et al "Investigation of DLC-Si Film Deposited Inside a 304SS Pipe Using a Novel Hollow Cathode Plasma Immersion Ion Processing Method"; Society of Vacuum Coaters 50th Annual Technical Conference Proceedings, 2007 (pp. 59-62); Cited as A in ISR (Apr. 4, 2014) issued in related PCT/US2013/071059.
Chen, et al., "Development and Characterization of Micromachined Hollow Cathode Plasma Display Devices," Journal of Microelectromechanical Systems, vol. 11, No. 5, Oct. 2002. pp. 536-543.
"Cold War Against Hydrates," available at http://www.ntnu.no/gemini/2003-06e/28-31.htm. retrieved on May 16, 2007, 5 pgs.
Denes, et al "Hexamethyldisiloxane-Plasma Coating of Wood Surfaces for Creating Water Repellent Characteristics"; Holzforschung, 1999, vol. 53, No. 3., pp. 318-326; Cited as A in ISR (Apr. 4, 2014) issued in related PCT/US2013/071059.
"Diamond-like Carbon," available at http://en.wikipedia.org/wiki/Diamond-like_carbon, retrieved on May 16, 2007, 6 pgs.
"Hollow Cathodes," available at http://www.engr.colostate.edu/ionstand/research_hollowcathods.html, retrieved on May 17, 2007, 3 pgs.
"Hollow Cathode Plasma Source," available at http://www.vtd.de/en/produkte/komponenten/ko_ref2.php, retrieved on May 17, 2007, 1 pg.
Hosokawa, et al., "Self-sputtering phenomena in high-rate coaxial cylindrical magnetron sputtering," J. Vac. Sci. Technol., vol. 14, No. 1, Jan./Feb. 1997. pp. 143-146.
Kostov, et al., "Two Dimensional Computer Simulation of Plasma Immersion Ion Implantation," Brazilian Journal of Physics, vol. 34, No. 4B, Dec. 2004.
Kvenvolden, "Methane Hydrate—A Major Reservoir of Carbon in the Shallow Geosphere?"; Chemical Geology, 71 (1988), Elsevier Science Publishers B.V., Amsterdam—Printed in The Netherlands, pp. 41-51.
Liang, et al. "Diamond Growth by Hallow Cathode Arc Plasma Chemical Vapor Deposition.", Journal of Materials Research, vol. 13, No. 11, Nov. 1998, pp. 3114-3121.

(56) References Cited

OTHER PUBLICATIONS

Makogon, "Hydrates of Hydrocarbons", PennWell Books, Pennwell Publishing Co., Tulsa, Ok 1997; (cover page and table of contents provided).

Monaghan, et al. "Diamond-Like Carbon Coatings," Materials World, vol. 1 No. 6 pp. 347-349, Jun. 1993, available at http://www.azom.com/details.asp?ArticleID=623, retrieved on May 16, 2007.

Nerheim, et al., "Investigation of Hydrate Kinetics in the Nucleation and Early Growth Phase by Laser Light Scattering"; Proceedings of the Second (1992) International Offshore and Polar engineering Conference, San Francisco, USA, Jun. 14-19, 1992; ISBN 1-880653-00-1 (Set); ISBN 1-880653-01-X (vol. 1); pp. 620-627.

Nwankire, et al "Enhancing the Mechanical Properties of Superhydrophobic Atmospheric Pressure Plasma Deposited Siloxane Coatings"; Plasma Processes and Polymers, Jan. 2011, vol. 8, Issue 4, pp. 305-315; Cited as Y in ISR (Apr. 4, 2014) issued in related PCT/US2013/071059.

"Plasma-enhanced Chemical Vapor Deposition," available at http://en.wikipedia.org/wiki/Plasma-enhanced_chemical_vapor_deposition, retrieved on May 18, 2007, 3 pgs.

"Plasma Immersion Ion Implantation (PI3)—The Technology, Applications and Success to Date," Materials Australia, vol. 34, No. 1, p. 9, Jan./Feb. 2002, available at http://www.azom.com/details.asp?ArticleID=2090, retrieved on May 16, 2007, 3 pgs.

"Plasma Immersion Ion Processing," 18-Steam Turbine Technology Brochure, available at http://www.swri.org/3pubs/brochure/d18/plasma/plasma.htm, retrieved on May 16, 2007, 2 pgs.

Shrader, et al., "Hollow Cathode Lamps—Yesterday, Today and Tomorrow," Mar. 1999, available at https://www.varianinc.com/media/sci/apps/a-aa14.pdf, retrieved on May 15, 2008, 7 pgs.

Sloan, Jr. et al., "Clathrate Hydrates of Natural Gases", Marcel Dekker, Inc., NY and Basel, Library of Congress Cataloging-in Publication Data; Chemical Industries, ISBN 0-8247-8296-8 (alk. paper), vol. 39;(cover page and table of contents provided).

"SwRI Surface Modification Facility Offers Two New Capabilities," available at http://www.swri.org/9what/releases/2000/PIIP.htm, retrieved on May 16, 2007, 2 pgs.

Tabuchi, et al, "Hollow Electrode Enhanced Radio Frequency Glos Plasma and Its Application to the Chemical Vapor Deposition of Microcrystaline Silicon"., J. Vac. Sci. Technol. A 22(5), Sep./Oct. 2004, pp. 2139-2144.

Tian, et al, "Theoretical Investigation of Plasma Immersion Ion Implantation of Cylindrical Bore Using Hollow Cathode Plasma Discharge", Surface and Coatings Technology 203 (2009) pp. 2727-2730.

Wei, "A novel High-Intensity Metal Ion Source for Plasma Immersion Implantation and Deposition (MPIII&D) 18-9292," available at http://www.swri.org/3pubs/IRD2003/Synopses/189292.htm, retrieved on May 16, 2007, 2 pgs.

Wei, et al, "Magnetic Field Enhanced Plasma (MFEP) Deposition of Inner Surfaces of Tubes", Surface and Coatings Technology 188-189 (2004) pp. 691-696.

Xu, et al. "Double glow plasma surface alloying and plasma nitride," Surface and Coating Technology vol. 201, Issue 9-11, Feb. 2007, pp. 4822-4825 (abstract provided).

Zizka, "Plasma Deposition of Thin Metal Layers in the Discharge With a Hollow Target", Czech. J. Phys. B 33 (1983), pp. 14-24.

Extended European Search Report dated Feb. 24, 2017 issued in related European Patent Application No. 13856748.2.

Levasseur, Olivier, et al: "Deposition of Hydrophobic Functional Groups on Wood Surfaces Using Atmospheric-Pressure Dielectric Barier Discharge in Helium-Hexamethyldisiloxane Gas Mixtures", Plasma Processes and Polymers, vol. 9, No. 11-12, Jul. 30, 2012, pp. 1168-1175.

Zou, M., et al: "Effects of Surface Roughness and Energy on Ice Adhesion Strength"; Applied Surface Science vol. 257, No. 8, Feb. 2011, pp. 3786-3792.

Australian Examination Report dated Jun. 27, 2017 issued in related Australian Patent Application No. 2013348056.

SUPERHYDROPHOBIC COMPOSITIONS AND COATING PROCESS FOR THE INTERNAL SURFACE OF TUBULAR STRUCTURES

CROSS REFERENCE TO RELATED APPLICATIONS

The present application is a divisional of U.S. application Ser. No. 14/819,129, filed Aug. 5, 2015, which is a divisional of U.S. application Ser. No. 13/683,690, filed Nov. 21, 2012, now U.S. Pat. No. 9,121,540 issued Sep. 1, 2015, the teachings of which are incorporated herein by reference.

FIELD OF INVENTION

The present disclosure relates to superhydrophobic conformal coatings presented on the internal surface of relatively long tubular structures and processes for forming such coatings. In particular, the present invention relates to superhydrophobic coatings that mitigate the nucleation, growth and adhesion of hydrocarbon hydrates and inorganic scales on the internal surface of tubular structures.

BACKGROUND

Hydrates and, in particular, clathrate hydrates are understood to be crystalline water-based solids physically resembling ice, in which methane and other relatively small hydrocarbons are trapped. Methane hydrate deposits found on and beneath the ocean floor and in certain regions of permafrost constitute the majority of known natural gas reserves on the planet. In addition, hydrates of methane and other relatively small hydrocarbons form in producing petroleum wells and gas or oil pipelines. However, hydrate formation within producing wells and pipelines lead to solid plugs of ice with gas trapped within that occlude product flow when unmitigated.

Approximately 10 to 15% of production costs may be invested in the prevention of hydrate formation using technologies based on chemical additives (e.g., methanol, siloxane oligomers, poly-N-vinylpyrrolidone, and aluminum sulfate) and physical methods (e.g., high-frequency electromagnetic fields). However, when such preventative methods fail, the removal of a continuous hydrate plug, for example, in an offshore pipeline is costly. Mitigation strategies that are not reliant on chemical additives or external physical methods may offer an extraordinary cost savings to pipeline operations if an intrinsic property of the surfaces which contact petroleum, and therefore such hydrates, can be manipulated to reduce or eliminate the nucleation and/or adhesion of hydrates on such surfaces.

Providing organosilicone functionalization and coatings which decrease the adhesion of hydrates to these surfaces have been attempted. The hydrophobization of the metal surface has relied on, for example, reacting iron oxyhydroxide functional groups present on the surface of carbon steels with trimethyl chlorosilane or chlorosiloxane oligomers, as well as the fluorine-substituted analogs of these reactants. While these strategies may result in surfaces that can be classified as hydrophobic relative to water, with water contact angles approaching 120°, these levels of hydrophobicity have been considered insufficient to inhibit hydrate nucleation, growth and adhesion on metal surfaces.

SUMMARY

An aspect of the present disclosure relates to a method of depositing a conformal coating. The method includes creating a vacuum within an interior volume of a tubular structure, wherein the tubular structure also includes an internal surface. Gas is supplied to the interior volume of the tubular structure, wherein the gas includes a plasma precursor in the gas phase. The tubular structure is biased relative to ground. Plasma is formed that may be cyclically positioned along the length of the tubular structure. Positive ions of the plasma precursor gas are generated and then may be accelerated to the internal surface and deposited on the internal surface forming a coating, wherein the coating exhibits a water contact angle of greater than 120°.

In a related aspect, the present disclosure relates to a conformal coating disposed on a tubular structure, comprising a tubular structure having an internal surface and an interior volume, and a carbo-siloxane coating disposed on the internal surface, wherein the coating has a water contact angle of greater than 120°. The coating comprises 50 to 60 atomic percent carbon, 20 to 30 atomic percent oxygen, and 15 to 25 atomic percent silicon. The coating, at a depth of up to 300 Angstroms, includes the following chemical bond types: (a) Si—O— at a relative concentration of 38.5 (±12) %; (b) Si—C at a relative concentration of 25.6 (±5) %; (c) C—O at a relative concentration of 4.5 (±3) %; and (d) C—C at a relative concentration of 31.4 (±2) %

A further aspect of the present disclosure relates to a system for forming a conformal coating in a tubular structure. The system includes a tubular structure including an internal surface defining an interior volume and at least two opposing ends, wherein each opposing end includes an opening. The system also includes at least two vacuum pumping stations, wherein each vacuum pumping station is coupled to one of the openings. The system further includes a gas supply port coupled to the interior volume via a tubular electrode of small diameter (i.e., 0.125-0.5 inch OD) at ground (or positive) potential spanning the length of the tubular structure and centrally-suspended under tension, through which gas is supplied and exited into the internal volume of tubular structure at approximately midway of length of tubular structure through a gas diffuser. In addition, as an optional feature, the system may include a plurality of magnetic field coils, wherein each magnetic field coil is arranged around the tubular structure and the magnetic field coils are spaced along the length of the tubular structure. Furthermore, the optional feature of the system includes an arbitrary waveform generator electrically connected to the magnetic field coils configured to impose a variable current to the magnetic field coils and configured to provide a phase offset between at least two of the magnetic field coils. These optional features of the system may be used to assist the static- or dynamic positioning of a plasma as formed inside the tubular structure.

BRIEF DESCRIPTION OF THE DRAWINGS

The above-mentioned and other features of this disclosure, and the manner of attaining them, may become more apparent and better understood by reference to the following description of embodiments described herein taken in conjunction with the accompanying drawings, wherein.

DETAILED DESCRIPTION

The present disclosure relates to superhydrophobic conformal coatings presented on the internal surface of relatively long tubular structures and processes for forming such coatings. In particular, the present invention relates to superhydrophobic coatings that mitigate the nucleation, growth and adhesion of hydrocarbon hydrates, organic deposits, and inorganic scales on the internal surface of tubular structures.

As noted above, hydrates and, in particular, clathrate hydrates, are understood as crystalline water-based solids in which relatively small hydrocarbons or other low molecular weight compounds are trapped inside hydrogen bonded water molecules. Stated another way, hydrates are crystalline compounds, which comprise two constituents including host molecules (or water molecules) that form a hydrogen-bonded solid lattice structure and guest molecules (including hydrocarbons or other relatively low molecular weight compounds) trapped in the host molecules. The hydrocarbons are trapped without chemical bonding inside the three-dimensional lattice structure formed by the hydrogen bonding of the water molecules. Non-limiting examples of hydrocarbons may include methane, ethane, propane, isobutene, 2-methyl butane, methylcyclopentane, methylcyclohexane, cyclooctane and combinations thereof. Other, non-hydrocarbon hydrates may include carbon dioxide, hydrogen sulfide, nitrogen, chlorine, etc.

Hydrates may form if gas and water are present under the appropriate phase-state conditions. In the case of a pipeline or well, hydrates can form in the bulk flow or on metal surfaces, i.e., surfaces in or bounding the flow. Typically, flow bounding a metal surface is colder than the bulk flow. The colder temperatures promote hydrate formation on the metal surfaces, which may provide nucleation sites for the formation of the crystalline lattice. Water can wet the metal, and subsequently, clathrate gas-hydrates can form from gas molecules originally dissolved in the water phase. Hydrate nucleation may occur at nuclei sizes ranging from 5 nm to 30 nm. These nuclei are metastable and may agglomerate into larger, stable hydrate clusters in the size range of 100 to 2000 nm.

Under conditions of supersaturated gas in the water phase, nucleation proceeds much more actively at the water-metal interface compared with gas-water interfaces away from the metal surface. In particular, the surface roughness of an unmodified metal substrate, having relatively high surface energy, may play two relatively important roles in the activity of hydrate nucleation. First, the surface roughness may create areas of water-phase disruption at the surface, lowering the barrier to hydrate formation. Second, the formation of microscopic gas pockets within the asperities of the surface enables hydrate growth by creating a relatively large number of gas-liquid interfaces.

Figure 1:
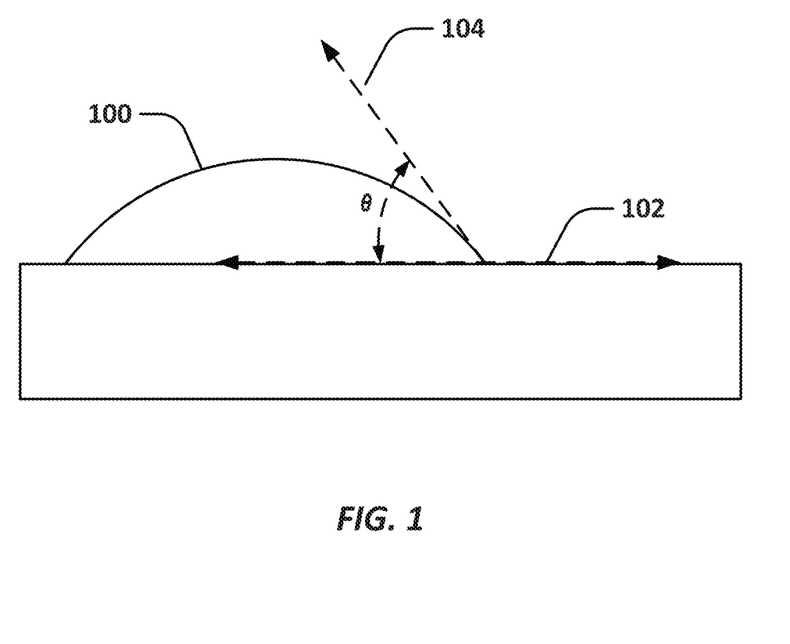
FIG. 1 illustrates a schematic of water contact angle measurement.

The present disclosure is directed to modifying the surface state of the internal surfaces of the pipe wall, such that the surfaces exhibit superhydrophobicity, reducing the surface energy and wettability of water on the pipe wall with respect to water. Hydrophobicity may be understood as the repulsion of water from a surface of a given material, this is opposed to hydrophilicity wherein water is attracted to the surface of a given material. Hydrophobicity may be quantified in terms of contact angle, which as illustrated in FIG. 1, is the angle $\theta$ that a drop of water 100 forms relative to a given surface 102. The lower the contact angle, the more the water is attracted to and wets the surface. The greater the contact angle, the less water wets the surface. The ability of water to "wet" or "wet out" a surface indicates the ability of the water to flow and cover a surface to maximize the contact area and the attractive forces between the water and surface. In FIG. 1, the contact angle may be measured in a mineral oil environment as opposed to an air environment.

Hydrophobic materials may generally be understood as materials having water contact angles that are 90° or greater. Superhydrophobic materials may be understood herein as materials having a contact angle with water that is 120° or greater. Thus, the internal surfaces of the tubular structures discussed herein are modified to reduce the surface energy of the surfaces relative to water therefore increasing the hydrophobicity to contact angles of 120° or greater. As understood herein, the measurements may be performed in mineral oil. This serves as a reference environment to approximate the environment in an oil-producing well or flow line.

The interior surface of the tubular structures may be modified by coating the structure with superhydrophobic material which provides a conformal coating. Employing high-resolution X-ray photoelectron spectroscopy (XPS), the relative contribution of different bonding states comprising the superhydrophobic coating was determined from the average XPS-measured states of each element involved in a given bond type. It has been determined from these quantitative results that the superhydrophobic coatings may include, consist essentially of, or consist of one or more substantially amorphous domains of the following chemical bond types: (a) Si—O— at a relative concentration of 38.5 (±12) %; (b) Si—C at a relative concentration of 25.6 (±5) %; (c) C—O at a relative concentration of 4.5 (±3) %; and (d) C—C at a relative concentration of 31.4 (±2) %. Reference to the feature that the domains are substantially amorphous may be understood as that situation wherein 90% or greater of the domains are amorphous or non-crystalline.

The coatings may include, consist essentially of, or consist of 50 to 60 atomic percent carbon, including all values and ranges therein, 20 to 30 atomic percent oxygen, including all values and ranges therein, and 15 to 25 atomic percent silicon, including all values and ranges therein. The elements are present at a total amount of 100 atomic percent; however, impurities may be present up to 1 atomic percent of the total composition. Preferably, the coatings may be composed of 56 to 57 atomic percent carbon, including all values and ranges therein, 20 to 26 atomic percent oxygen, including all values and ranges therein, and 17 to 23 atomic percent silicon, including all values and ranges therein. In addition, such atomic percent concentrations and the aforementioned bond types are such that they are present at the surface and at depths of 100 Angstroms, 200 Angstroms and 300 Angstroms into the coating. Thus, the indicated atomic percent concentration of C, O and Si is present in a relatively uniform profile from the surface to a depth of 300 angstroms.

The coatings herein may be preferably formed from silane compounds providing C, H, O and Si. Preferably a plasma precursor may include hexamethyldisiloxane (HMDSO) having the formula $(CH_3)_3Si$—O—$Si(CH_3)_3$. It can be appreciated that the precursors so identified may then form a plasma by themselves or with the assistance of a noble gas such as Ar (preferably) or He, and coat the internal surfaces of the tubular structure to provide the amorphous domains noted above. Additionally, other preferred precursors useful in forming superhydrophobic coatings on the internal surface of tubular structures, in accordance with the process methods described herein, include: (1) hexamethyldisilazane $(CH_3)_3Si$—N—$Si(CH_3)_3$; (2) bis-trifluoropropyl tetramethyldisiloxane $(CF_3C_2H_4)$ $Si(CH_3)_2$—O—$Si(CH_3)_2$ $(CF_3C_2H_4)$; and (3) combinations of HMDSO or (1) or (2) with a volatile fluorocarbon including, but not limited to, perfluoropropane $(C_3F_8)$, hexafluoropropylene oxide $(C_3F_6O)$, perfluorocyclohexane $(C_6F_{12})$, and hexafluorobenzene $(C_6F_6)$.

Tubular structures on which the superhydrophobic coating are applied may be understood as structures having a length to diameter (or largest linear cross-section) ratio of 10:1 or greater, such as 20:1, 30:1, 100:1, and up to 1,000:1. The tubular structure may be 10 or more feet in length, including all values and ranges between 10 feet and 100 feet, including all values and increments therein, such as in the range of 10 to 50 feet, 20 to 70 feet, etc. The tubular structures may generally be circular in cross-section. However, in other embodiments, the tubular structures may exhibit rectangular, square, triangular or geometric cross-sections. Additional embodiments may include non-linear (in plane) hollow shapes, such as "S", bends, and split rings, or helical (out-of-plane) shapes. In these cases, the internal electrode/gas-manifold at ground (or positive) potential is suspended with periodic dielectric supports making contact with the internal wall of the structure, as opposed to an unsupported, though tensioned, electrode for most linear shapes less than or equal to 40-ft in length. Such dielectric supports are translated during the coating process so that the area of the support making direct contact with the internal wall of the structure is unmasked, thus avoiding the potential for leaving behind periodic uncoated patches or coating variances along the length of the structure wall at the periodic locations of the said supports.

The tubular structures may exhibit an initial average surface roughness (Ra) of less than 10 μm. The tubular structures may be iron based and may include steel and preferably, stainless steel or carbon steel.

Figure 2A:
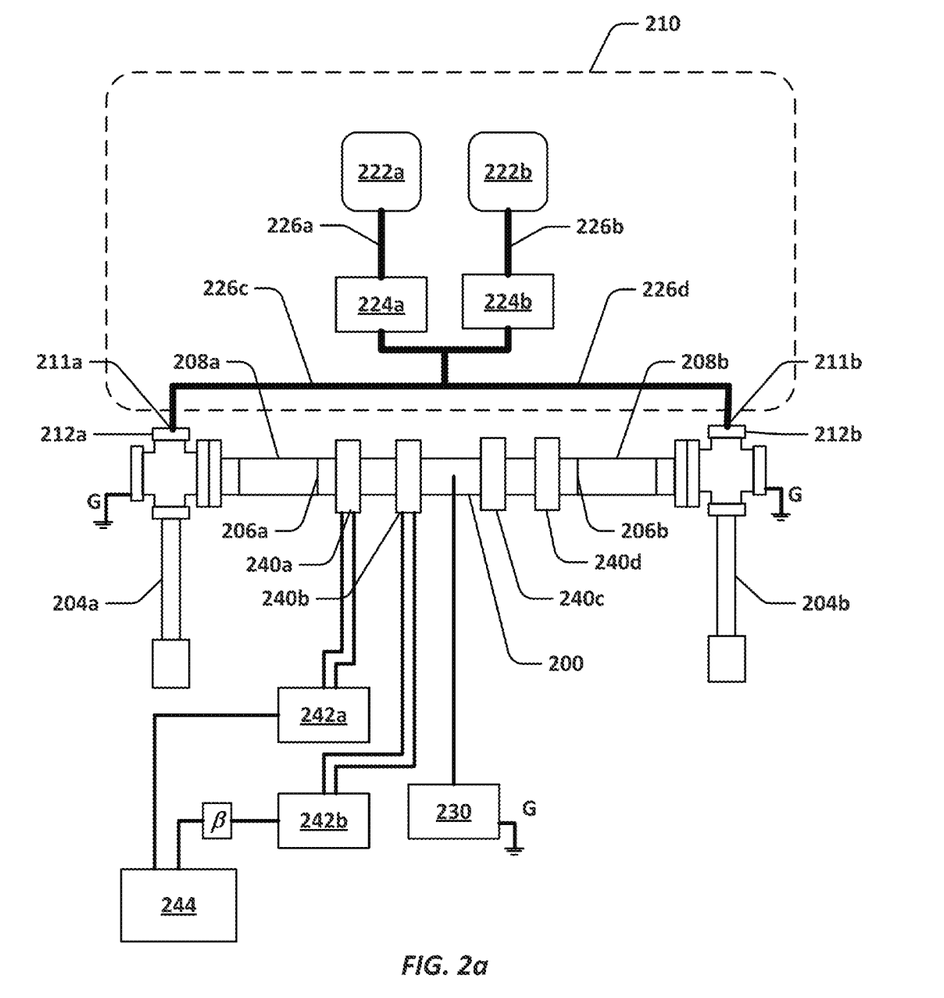
FIG. 2*a* illustrates a schematic of an exemplary embodiment of a system for performing the process of the present disclosure.

The coatings may be deposited on a structure utilizing a magnetically-assisted plasma enhanced chemical vapor deposition system, an example of which is illustrated in FIG. 2a. However, it is to be understood that magnetic field assistance is not a necessary requirement of the process conditions, but rather may be used as needed to assist the deposition process by concentrating or translating—either dynamically or statically—the plasma formed inside the tubular structure. The system includes the tubular structure 200, in which the coating will be deposited, mounted between two high-vacuum pump stations 204a, 204b on each end 206a, 206b of the tubular structure 200, i.e., at each opening of the tubular structure. Accordingly, should additional openings be provided in the tubular structure, additional high-vacuum pumps may be mounted at these openings. Alternatively, additional opening may be sealed to prevent escape of the processing gasses. The high-vacuum pumps 204a, 204b are operatively connected directly or indirectly to the tubular structure in such a manner that gas may be evacuated from the interior volume of the tubular structure. A combination of vacuum pumps may be arranged in the high-vacuum pump stations. For example, a positive displacement pump to achieve vacuum and a turbomolecular vacuum pump to achieve high-vacuum may be utilized. The high vacuum pump station may achieve a vacuum in the range of $1*10^{-1}$ Torr to $1*10^{-7}$ Torr.

Figure 2B:
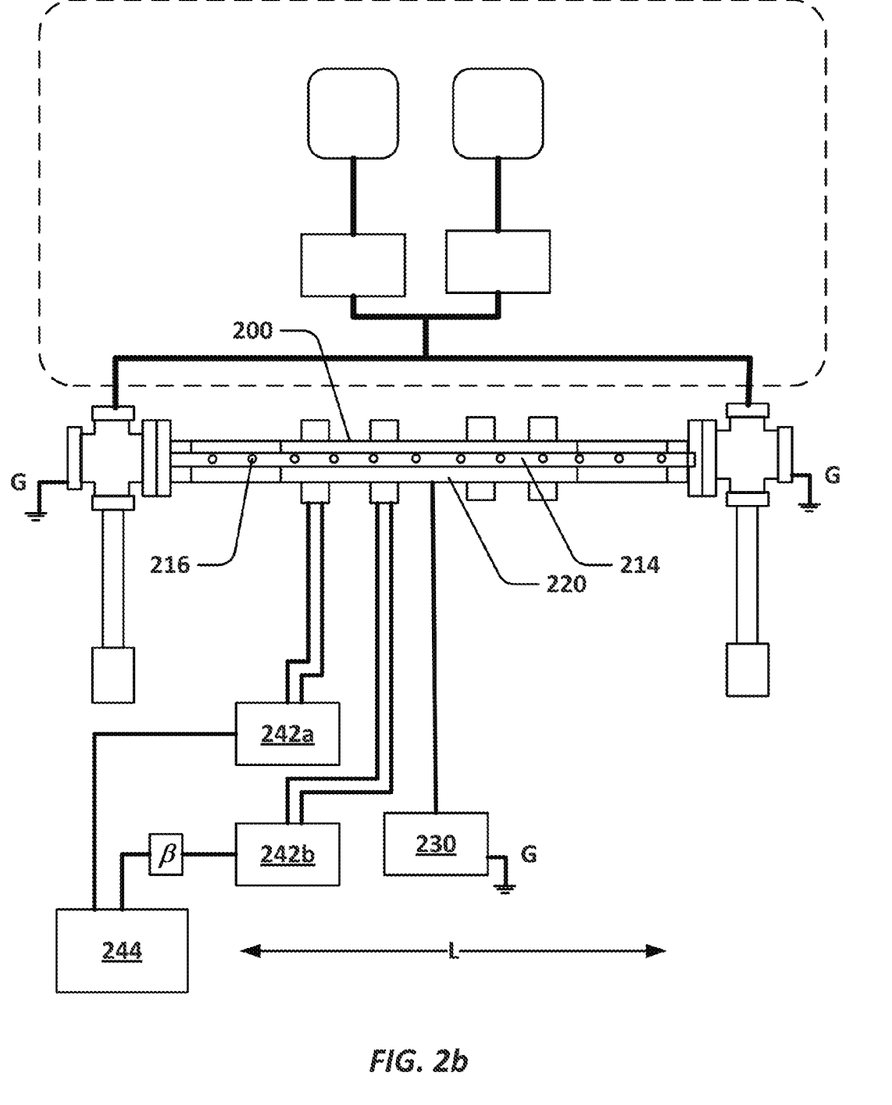
FIG. 2*b* illustrates a schematic of another exemplary embodiment of the system for performing the process of the present disclosure.

The tubular structure is electrically isolated from the high-vacuum pumping stations using vacuum compatible insulators 208a, 208b. Further, components connected to the vacuum pumping stations 204 are connected to an electrical ground G. A gas supply system 210 is connected to a gas inlet port 211a, 211b located at distal portions of the apparatus 212a, 212b. An internal gas manifold 214 (see FIG. 2b), which also serves as an electrode at ground potential, running along the axial length L of the tubular structure, including a plurality of gas ports 216 may also be provided to distribute the process gasses evenly throughout the interior volume 220 of the tubular structure 200. The gas ports are operatively coupled to the interior volume of the tubular structure in a manner that a pathway for gas to pass from the storage tanks to the gas ports is provided, filling the interior volume of the tubular structure with the supplied gasses. The gas supply system 210 may include storage tanks or devices 222a, 222b in which the gas is stored in either a gas or liquid form. The gas supply system 210 may also include mass flow controllers 224a, 224b for controlling the flow rate of the gas entering the system. The gasses are passed through supply lines 226a, 226b, 226c, and 226d into the gas inlet ports 211a, 211b. While only two storage tanks and mass flow controllers are illustrated, more than two may be present, such as three, four and even up to ten. Gasses utilized in the system, process and coatings herein include a chemical precursor used alone, or in combination with an inert gas, such as argon. The inert gases maybe supplied to the interior volume at a ratio of 1:40 to 10:1 of the inert gas to the plasma precursor A high-voltage, pulsed DC power supply 230 is electrically connected to the tubular structure 200. The negatively biased, pulsed voltage may range from 0.5-10 kV, including all values and ranges therein with a pulsed frequency ranging from 500-5000 Hz, including all values and ranges therein and a pulse width ranging from 1 to 100 μs, including all values and ranges therein. The pulsed voltage from the power supply may be biased negatively relative to the system ground, forming a plasma in a hollow space of the structure. The plasma consists of electrons, ions and neutrals at various energy states. When the chemical precursors (e.g. HMDSO) is fed into the plasma it may fragment, resulting in the formation of ionized and un-ionized (radicals) fragments of HMDSO molecules. The negatively biased voltage extracts the positively charged ions from the plasma and accelerates the ions to the internal surface of the tubular structure. The acceleration is with relatively high terminal velocities and relatively high kinetic energy. When energetic ions and radicals of the fragments of the HMDSO molecules deposit on the internal surface of the tubular structure a coating with the required composition may form.

As illustrated in FIG. 2a, the system preferably includes two or more magnetic field coils 240a, 240b, 240c, 240d, i.e., solenoids, are configured or arranged around the exterior of the tubular structure. While four coils are illustrated, up to 10 or 20 coils may be provided depending upon the length of the pipe. Each magnetic field coil may exhibit the cross-sections shape of a collar and wrap around the periphery of the tubular structure 200, spaced along the axial length L of the tubular structure 200. The magnetic field coils are connected to one or more DC, constant-current power supplies 242a, 242b producing a magnetic field. The magnetic field may penetrate the wall thickness, depending on the magnetic permeability of the structure. Magnetic flux densities in the range of 1 gauss to 2000 gauss, including all values and ranges therein, may arise in the hollow region or interior volume 220 of the tubular structure, i.e., the plasma region.

An arbitrary wave form generator 244 is also provided and electrically connected to the magnetic field coils to impose a variable current to each field coil 240 combined with a phase offset β between at least two, and up to all of the magnetic field coils, e.g., 0° to 180° phase shift. The plasma density may therefore be cyclically swept or positioned over the length of the structure. This is reference to the feature that the plasma may be relatively confined and intensified (e.g. higher relative plasma concentration) at selected locations along the tubular structure length. The swept magnetic flux may therefore form a relatively more uniform plasma within the tubular structures as compared to that situation where no magnetic flux or a static magnetic flux is provided. Accordingly, a relatively more uniform coating deposition along the internal surface of the relatively long hollow structure may now be achieved as needed.

Figure 3:
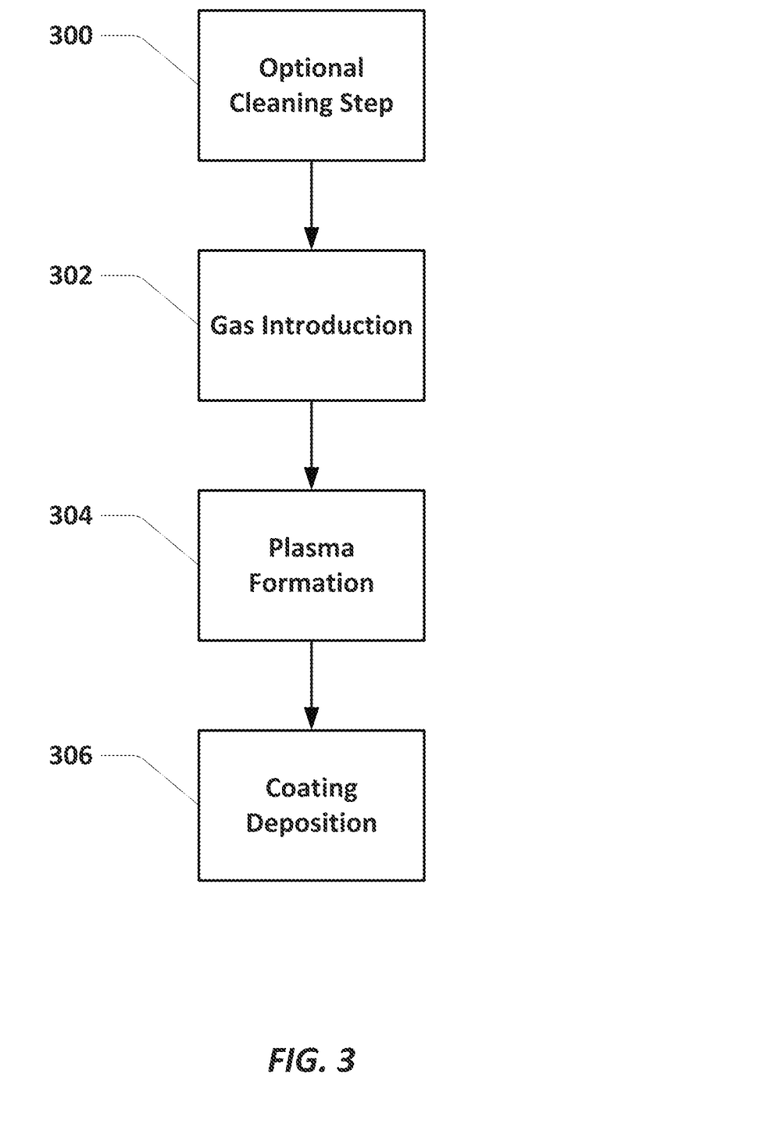
FIG. 3 illustrates an exemplary method for performing the process of the present disclosure.

A process for forming the superhydrophobic coatings is further described herein with respect to FIG. 3. The process may optionally begin with a cleaning step 300, such as sputter cleaning, to remove contamination including organic species or inorganic surface oxides, from the interior surfaces of the tubular substrates. Initially, a vacuum is created or drawn on the interior volume of the tubular member to a pressure in the range of $1*10^{-6}$ Torr to $1*10^{-7}$ Torr, including all values and ranges therein. Argon gas and, optionally hydrogen gas as a reactive gas, is introduced into the tubular substrate through the gas supply system, such that a pressure in the range of 10 mTorr to 50 mTorr, including all values and ranges therein, is reached. Other inert gases (e.g., xenon, helium, neon, krypton or combinations thereof) may be used alone or in combination with argon gas.

While maintaining the above noted gas pressures, a negatively biased, pulsed voltage ranging from 0.5 to 10 kV, including all values and ranges therein, with a pulse frequency ranging from 500 to 5000 Hz, including all values and ranges therein, and a pulse width of 1 to 100 microseconds, including all values and ranges therein. Sputter cleaning may occur for a period ranging from 30 minutes to 120 minutes, including all values and ranges therein. Positive ions (and/or positive ion-radicals) generated by the plasma are accelerated towards the negatively biased internal surface of the tubular member with relatively high kinetic energy, resulting in the sputter cleaning of surface contaminants from the surface of the structure. During this process, negatively charged species, including electrons and ion-radicals, accelerate toward the internal electrode/gas-manifold set at ground potential.

Following the optional plasma sputter cleaning, the chemical precursor gas, such as HMDSO described above, may be supplied alone or co-mixed with an inert gas, such as argon, and metered into the interior volume of the tubular structure at a constant flow rate 302. The precursor gas may be supplied at a flow rate of 1 to 100 sccm, including all values and ranges therein, while the inert gas may be supplied at a flow rate of 1 to 200 sccm, including all values and ranges therein. The gas space, or interior volume, of the tubular structure is maintained at a total pressure ranging from 10 mTorr to 100 mTorr, including all values and ranges therein.

To initiate deposition of the coating onto the internal surface of the tubular structure, a plasma is formed 304 in the interior volume by electrically exciting the tubular structure through negatively biasing the tubular structure with a pulsed voltage in the range of 0.5 kV to 10 kV, including all values and ranges therein, relative to ground at a pulse frequency of 500 Hz to 5000 Hz, including all values and ranges therein, and a pulse width ranging from 1 microseconds to 100 microseconds, including all values and ranges therein. The deposition period 306 may range from 60 minutes to 120 minutes, including all values and ranges therein. The resulting coating has a thickness of up to 2.0 micrometers, such as in the range of 0.2 to 2 micrometers, including all values and ranges. In addition, the resulting coating is conformal, i.e., conforming to the surface features of the substrate and exhibiting a deviation in thickness of less than or equal to 50% across the coating. After deposition, a substantially smooth and durable coating is formed having a chemical and structural composition that exhibits superhydrophobic surface properties and further inhibits the nucleation, growth, and adhesion of gas hydrates and/or adhesion of asphaltenes, waxes and inorganic scales on its surface.

The resulting coating compositions are characterized along the lines noted above. The water contact angle (WCA) of a liquid-water drop resting on the surface of a coated steel substrate immersed in mineral oil is determined to exceed 120° and reaches a value of 155°, including all values and ranges therein. As surface roughness increases, the water contact angle increases. Referring again to FIG. 1, the contact angle is determined by the angle θ formed between the surface plane 102 of the coated substrate, parallel with the solid-water interface, and the tangent line 104 at the water-oil interface intersecting the surface plane at the solid-water-oil triple point, measured through the water drop, wherein the oil is mineral oil. Measurement of the water contact angle may be achieved by methods conventionally practiced, which include, for example, a goniometer coupled with a relatively high resolution camera.

In addition, the resulting compositions exhibit reduced water-ice shear pressures (i.e., shear strengths). Specifically, the water ice shear pressures may be reduced by more than half when utilizing the superhydrophobic coatings (having a contact angle of 120° or greater) versus hydrophobic coatings (having a contact angle of less than 120°). The water-ice shear pressure may, for example, be less than or equal to 0.2 MPa, such as 0.001 MPa to 0.2 MPa, including all values and ranges therein. The water-ice shear pressure is understood as the amount of shear stress required to displace a water-ice drop bound to a surface, wherein the water-ice drop and surface are immersed in oil. This may be compared to the water-ice shear pressure of a water-ice drop on an electro-polished uncoated steel surface of 1.089 MPa. Stated another way, the water-ice shear pressure of the coated surface is half, or more than half, i.e., 1% to 50% of the water-ice shear pressure of uncoated surfaces of the same roughness.

Further, the resulting compositions exhibit a reduced shear pressure relative to hydrocarbon materials such as asphaltene and wax. Shear pressures may also be reduced by half or more than half, i.e., 1% to 50%, when utilizing the superhydrophobic coatings, such as less than or equal to 0.010 MPa. Thus, the coating also exhibits oleophobic characteristics, which may be understood as a molecule that is repelled from oil. In the case of inorganic scale, a shear pressure of less than or equal to 0.040 MPa may be used to dislodge inorganic scale composed of carbonate salts adhered to its surface, compared with 0.16 MPa for the bare surface.

The superhydrophobic and oleophobic nature of the coatings are useful in mitigating or inhibiting the nucleation, growth and adhesion of asphaltenes, waxes, and gas hydrates onto the internal surface of the steel pipe materials. Such properties bear significant benefits to the offshore pipeline industry by reducing the frequency in which product flow may be encumbered by stoppages due to gas hydrate, asphaltene or wax occlusions formed in the pipeline.

The compositions of matter of the preferred coatings described herein are understood to be accessible via the unique combination of the deposition process, the process conditions, and the preferred chemical precursors described herein. This, in turn, provides the superhydrophobicity and low surface-adhesion properties necessary for inhibiting the nucleation, growth, and adhesion of gas hydrates and the adhesion of asphaltenes, waxes and inorganic scales on steel substrates. Further, the coating is capable of resisting wear and abrasion. Moreover, the process is amenable to coating the internal surface of long tubular structures.

EXAMPLES

A number of steel substrates were provided having a variety of average surface roughness (Ra) ranging from 7.0 micro-inches to 30 micro-inches. The surface roughness of each substrate was measured using a stylus-type surface profilometer (Dektak 150, Veeco Instruments, Inc.) and collecting the surface profile over a scan distance of 1 cm. The average roughness, Ra, was determined by computing the arithmetic average of the absolute values of the vertical deviations (hills and valleys) in the surface profile. Coatings were produced on each sample 0.4 microns and 0.8 microns in thickness as described further in Table 1 below. Specifically, each sample was first sputter cleaned and then a coating was deposited using HMDSO precursor and Ar gas.

The hydrophobicity of each coating was characterized by measuring the water contact angle in mineral oil using a goniometer coupled with a high-resolution digital camera. As previously illustrated in FIG. 1, the water contact angle (WCA) was defined as the angle θ formed between the surface plane 102 of the coated substrate, parallel with the solid-water interface, and the tangent line 104 at the water-oil interface intersecting the surface plane at the solid-water-oil triple point, wherein the angle passes through the bubble. Digital image processing software (SIMAGIS®, Smart Imaging Technologies, Inc.) was employed to accurately derive the said WCAs from the captured images of the water drop and coated surface. The water contact angles for each sample are provided below in Table 1. As illustrated, the greater the roughness and thickness of the coating, the greater the water contact angle in oil. However, this effect is expected to reach a maximum, beyond which the contact angle decreases and the shear pressure, as described below, increases.

TABLE 1

Hydrophobic And Adhesion Characteristics Of The Coatings on Carbon Steel

| Uncoated Roughness, Ra (micro-inch) [micrometer] | Coating Thickness (micrometer) | WCA in Oil (deg) | Water-Ice Shear Pressure (MPa) |
|---|---|---|---|
| 7.0 [0.18] | 0.4 | 112 | 1.086 |
| 12.0 [0.30] | 0.8 | 123 | 0.445 |
| 15.0 [0.38] | 0.8 | 147 | 0.219 |
| 30.0 [0.76] | 0.8 | 153 | 0.063 |

Figure 4:
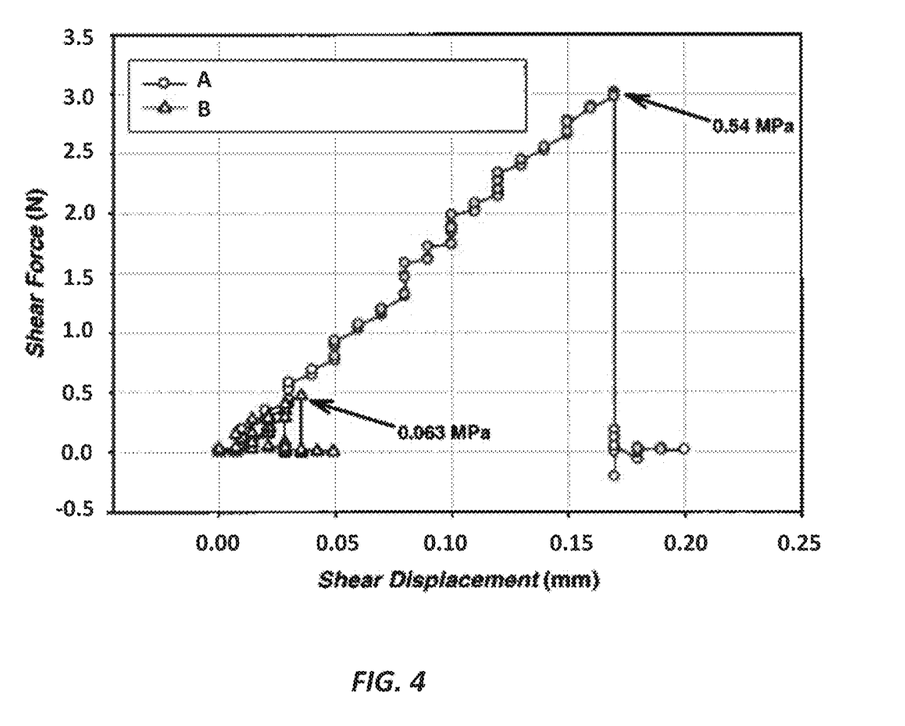
FIG. 4 illustrates the shear displacement versus shear force for water-ice on coated and uncoated structures.
Figure 5:
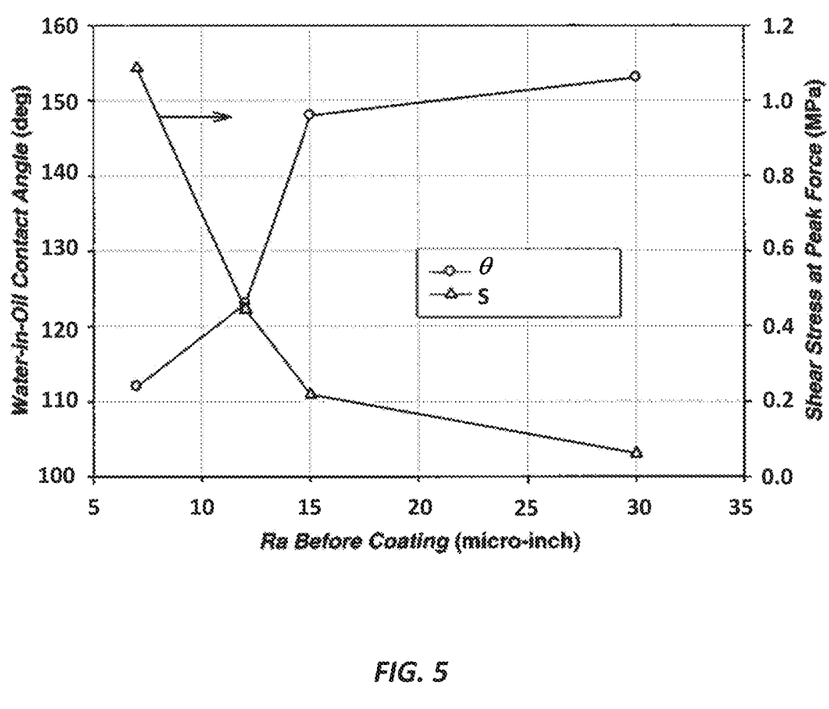
FIG. 5 illustrates the relationship of the water-in-oil contact angle and the shear stress at peak force (MPa) versus the surface roughness of water-ice on stainless steel.

The adhesion of water-ice characterized by the water-ice shear pressure (i.e., shear strength) was also measured for each coating. Specifically, the water-ice shear pressure was characterized by using an apparatus that measures adhesion between a water-ice drop and a coating on a steel substrate. A description of this apparatus and its application have been reported elsewhere [Zou, M.; Beckford, S.; Wei, R.; Ellis, C.; Hatton, G.; Miller, M. A., *Applied Surface Science* 257 (2011) 3786-3792]. The testing was performed at 262 K. FIG. 4 illustrates a comparison of the shear force (N) utilized to break the adhesion between bare, electropolished stainless steel A having a surface roughness of 5.0 micro-inches (0.13 micrometer) and stainless steel having the same roughness and a coating having a thickness of 0.8 microns B. As can be seen in FIG. 4, the shear stress required to displace a drop of water-ice bound to the coated surface was determined to reach a value as low as 0.0363 MPa at 262 K, whereas the electro-polished uncoated steel surface requires a shear stress approximately one order or magnitude higher to dislodge a water-ice drop of the same volume bound to its surface at a similar temperature. Table 1 lists the water-ice shear pressures for each coating and surface roughness on carbon steel substrates. In addition, FIG. 5 illustrates the relationship of the water-in-oil contact angle θ and the shear stress at peak force (MPa) S versus the surface roughness.

Figure 6:
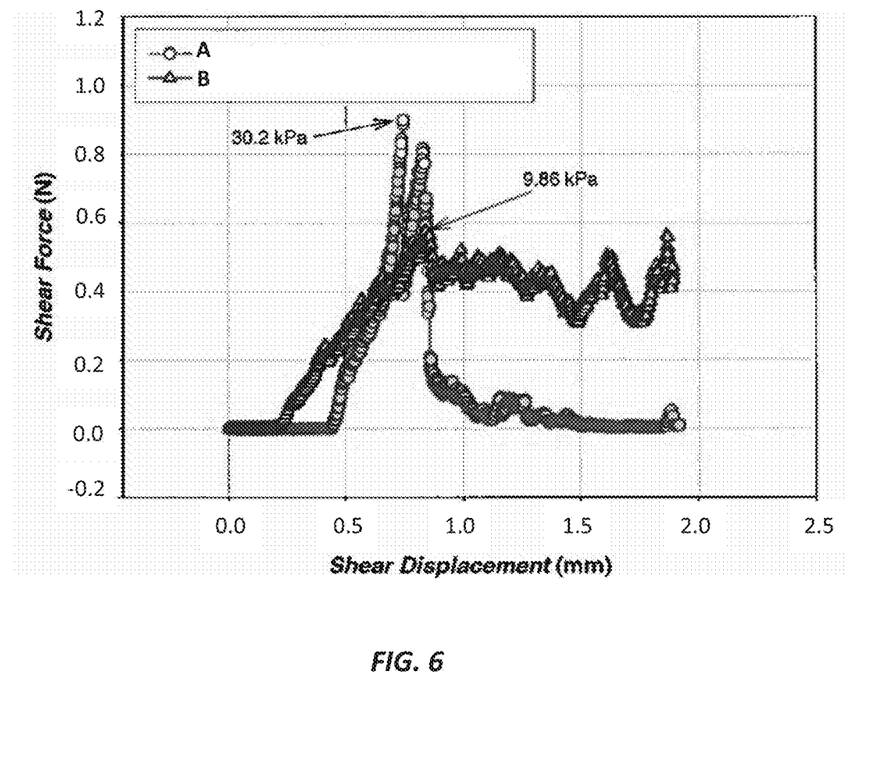
FIG. 6 illustrates the shear force versus shear displacement for both uncoated and coated carbon steel relative to solid asphaltenes.

The adhesion of solidified asphaltenes and wax was also determined using the measurement apparatus described above at 262K. In this example, the substrates were formed from carbon steel having a surface roughness of 30 micro-inch (0.76 micrometer). FIG. 6 illustrates the shear force versus shear displacement for both the bare carbon steel sample A and the coated carbon steel sample B. The peak shear-stress required to dislodge a drop of solid asphaltene from the surface of uncoated carbon steel in this example was 30.2 kPa, compared with 9.86 kPa for the coated steel.

The elemental composition and bonding states of matter of the preferred coatings derived from the conditions of the process may be characterized with respect to depth or thickness of the coating via X-ray photoelectron spectroscopy (XPS) also known as electron spectroscopy for chemical analysis (ESCA). XPS (or ESCA) may be understood as an elemental analysis technique for detecting elements with the exception of hydrogen and helium, having a nominal detection limit of approximately 0.1 atomic %. High-resolution XPS may also provide information regarding the bonding states of the elements in question. The elemental composition of the coatings formed herein is described in Table 2. Tables 3 through 5 provide the bonding state of the coatings.

TABLE 2

Relative Elemental Composition By Atomic Percent Of The Preferred Coating As A Function Of Depth

| Depth (Å) From Surface | Carbon | Oxygen | Silicon |
|---|---|---|---|
| Surface | 57 | 26 | 17 |
| 100 | 56 | 22 | 22 |
| 200 | 57 | 21 | 22 |
| 300 | 57 | 20 | 23 |

TABLE 3

Relative Concentration Of Bonding States For Carbon 1s High Resolution Region Of The XPS As A Function Of Depth

| Depth (Å) | C—Si | C—C, C—H | C—O | O—C=O |
|---|---|---|---|---|
| Surface | 33 | 61 | 4.8 | 1.5 |
| 100 | 43 | 55 | 2.6 | — |
| 200 | 44 | 53 | 3.0 | — |
| 300 | 42 | 54 | 3.4 | — |

TABLE 4

Relative Concentration Of Bonding State For Oxygen 1s High Resolution Region Of The XPS As A Function Of Depth

| Depth (Å) | O—Si | O—C |
|---|---|---|
| Surface | 86 | 14 |
| 100 | 83 | 17 |
| 200 | 90 | 10 |
| 300 | 91 | 9.1 |

TABLE 5

Relative Concentration Of Bonding State For Silicon 2p High Resolution Region Of The XPS As A Function Of Depth

| Depth (Å) | Si—C* | Si—O* |
|---|---|---|
| Surface | 38 | 62 |
| 100 | 55 | 45 |
| 200 | 55 | 45 |
| 300 | 55 | 45 |

*Combination of Si $2p_{3/2}$ and Si $2p_{1/2}$ peaks

Figure 7:
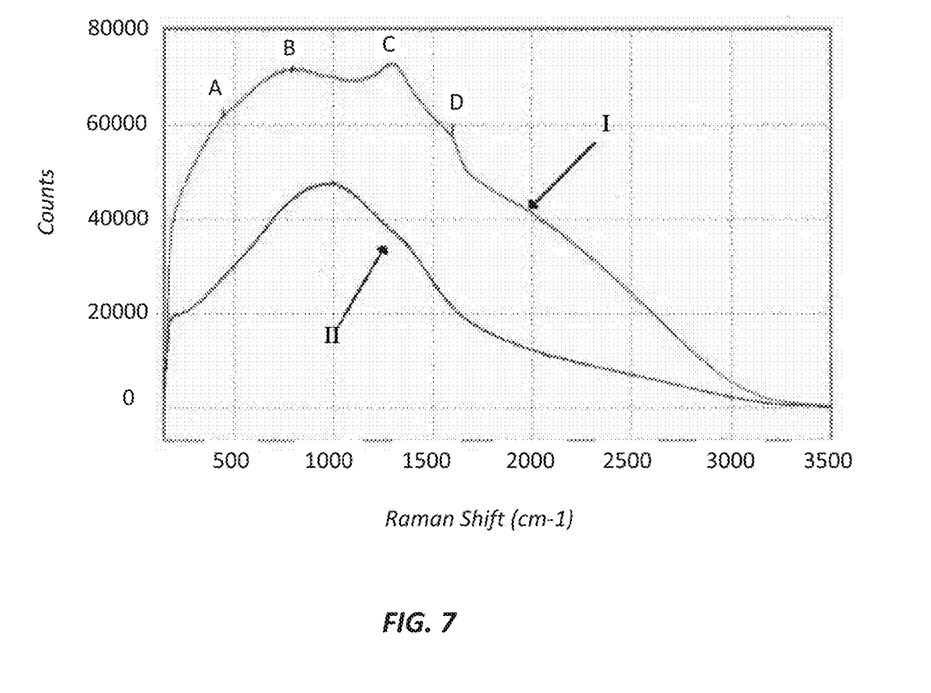
FIG. 7 illustrates the Raman spectrum for coatings produces by the process and system described herein versus conventional glow-discharge plasma enhanced chemical vapor deposition.

In addition, the coatings were examined utilizing Raman Spectroscopy to identify the unique molecular-structural characteristics of obtained using the processes claimed herein. A comparison was performed between the Raman spectrum of the coating and process described herein to that of conventional glow-discharge plasma enhanced chemical vapor deposition (PECVD). In both cases, HMDSO precursor was used in combination with Ar process gas. The spectra are illustrated in FIG. 7, wherein the spectrum exhibited by the present process is indicated as I and the spectrum exhibited by the conventional process is indicated as II.

As seen in the graph, the process of the described herein yields a coating that contains a substantially larger proportion of —Si—O—Si— structural groups than the conventional process. This is indicated by the symmetric —Si—O—Si— stretching vibrations in a broad region of the spectrum near 500 $cm^{-1}$, at point A, which is markedly depressed in the coating prepared by glow discharge. The broad spectral region near 793 $cm^{-1}$, point B, indicates a proportionally large contribution of terminal di- and trimethyl silanes [—Si(CH$_3$)$_x$], which emerge in the Raman spectrum as asymmetric Si—C stretching vibrations. Lastly, the spectral region between 1309 $cm^{-1}$ and 1350 $cm^{-1}$, point C, can be assigned to —CH$_2$— scissoring modes associated with the formation of carbosilanes [Si—CH$_2$—Si] in the coating. The relative contribution of this structural feature is again greater in the coating described herein than in the conventional coating.

While particular embodiments have been described, it should be understood that various changes, adaptations and modifications can be made therein without departing from the spirit of the invention and the scope of the appended claims. The scope of the invention should, therefore, be determined not with reference to the above description, but instead should be determined with reference to the appended claims along with their full scope of equivalents. Furthermore, it should be understood that the appended claims do not necessarily comprise the broadest scope of the invention which the applicant is entitled to claim, or the only manner(s) in which the invention may be claimed, or that all recited features are necessary.

What is claimed is:

1. A system for forming a conformal coating on a tubular structure, comprising:
   a tubular structure including an internal surface defining an interior volume and at least two opposing ends, wherein each opposing end includes an opening;
   at least two vacuum pumping stations, wherein each vacuum pumping station is coupled to one of said openings;
   a gas supply port coupled to said interior volume;
   a plurality of magnetic field coils, wherein each magnetic field coil is arranged around said tubular structure and said magnetic field coils are spaced along the length of said tubular structure; and
   an arbitrary waveform generator electrically connected to said magnetic field coils configured to impose a variable current to said magnetic field coils and configured to provide a phase offset between at least two of said magnetic field coils.

2. The system of claim 1, wherein said gas supply port includes an internal gas manifold extending along the axial length of said tubular structure.

3. The system of claim 1 wherein said magnetic field coils provide a magnetic flux density of 1-2000 gauss.

* * * * *